United States Patent
Moffat

(10) Patent No.: US 6,198,075 B1
(45) Date of Patent: Mar. 6, 2001

(54) RAPID HEATING AND COOLING VACUUM OVEN

(75) Inventor: William A. Moffat, San Jose, CA (US)

(73) Assignee: Yield Engineering Systems, Inc., San Jose, CA (US)

( * ) Notice: Subject to any disclaimer, the term of this patent is extended or adjusted under 35 U.S.C. 154(b) by 0 days.

(21) Appl. No.: 09/449,062

(22) Filed: Nov. 24, 1999

Related U.S. Application Data

(60) Provisional application No. 60/109,936, filed on Nov. 25, 1998.

(51) Int. Cl.[7] ........................................................ F27B 5/14
(52) U.S. Cl. .......................... 219/390; 118/724; 118/725; 392/416
(58) Field of Search ..................................... 219/390, 405, 219/411; 118/724, 725, 50.1; 392/416, 418

(56) References Cited

U.S. PATENT DOCUMENTS

| | | | |
|---|---|---|---|
| 4,091,257 | * 5/1978 | Anthony et al. | 219/121 EB |
| 4,914,276 | * 4/1990 | Blair | 219/390 |
| 5,115,118 | * 5/1992 | Harada et al. | 219/390 |
| 5,171,972 | * 12/1992 | Hidano | 219/390 |
| 5,308,955 | * 5/1994 | Watanabe | 219/390 |
| 5,332,557 | * 7/1994 | Sahoda et al. | 422/199 |
| 5,676,869 | * 10/1997 | Nakayama et al. | 219/390 |
| 5,777,300 | * 7/1998 | Homma et al. | 219/679 |
| 6,005,225 | * 12/1999 | Kowalski et al. | 219/390 |

* cited by examiner

Primary Examiner—Teresa Walberg
Assistant Examiner—Shawntina Fuqua
(74) Attorney, Agent, or Firm—Donald J. Pagel

(57) ABSTRACT

An oven for processing semiconductor wafers comprised of a first cylindrical canister, a second cylindrical canister that surrounds the first canister, and a third cylindrical canister that surrounds the second canister. The first canister is comprised of thin stainless steel so that it can be heated and cooled rapidly by band heaters positioned around its exterior. The second canister is comprised of stainless that it thermally insulates the first canister. The third canister is comprised of stainless steel that is thicker than the second canister so that the third canister can hold a sufficient vacuum for processing the wafers.

12 Claims, 2 Drawing Sheets

RAPID HEATING AND COOLING VACUUM OVEN

This appln. claims the benefit of Provisional No. 60/109,936 filed Nov. 25, 1998.

TECHNICAL FIELD

The present invention relates to an oven for processing semiconductor wafers and more particularly to an oven having a lightweight processing canister that can be heated and cooled rapidly, surrounded by a thermal insulating canister and a heavy vacuum canister.

BACKGROUND OF THE INVENTION

A trend in semiconductor device manufacturing is to replace the silicon dioxide dielectric layer with a thinner dielectric layer. Materials suitable for thinner dielectric layers include polyimides, BCB and perylene. When polyimides are used, the semiconductor wafer is coated with the polyimide and the wafer is baked at 450° C. for about one hour in order to solidify the polyimide and remove contaminants from the polyimide layer. Since oxygen reacts with the polyimide at high temperatures, the baking must be completed in an oxygen free environment, such as in a vacuum oven or in a diffusion furnace.

Prior art vacuum ovens comprise heavy stainless steel chambers and thus take a very long time to heat up to 450° C. and cool back down to room temperature. Therefore, what is needed by semiconductor manufacturers is a vacuum oven that can be heated and cooled rapidly.

SUMMARY OF THE PRESENT INVENTION

Briefly, the present invention is a rapid heating and cooling oven comprised of a first canister, a second canister and a third canister. The first canister is adapted for holding one or more items to be heated to a temperature of approximately 450° C. A plurality of band heaters positioned around the outside circumference of the first canister provide the heating. A first chamber is formed in the first canister for allowing an inert gas to be introduced uniformly into the first canister and a second chamber is formed in the first canister through which the inert gas is removed.

The second canister encircles the first canister and has an inner surface and an outer surface, with a first cavity being formed between the first canister and the inner surface of the second canister. The heating elements for heating the first canister are positioned in the first cavity in thermal contact with the outside of the first canister. The inner surface of the second canister has a reflective finish so that heat is reflected back toward the first canister.

The third canister encircles the second canister and is adapted to hold a vacuum of at least approximately one torr around and inside of the first and second canisters. An inert gas inlet is positioned so as to direct an inert gas into the first chamber and a vacuum outlet is positioned so as to allow a vacuum to be drawn on the second chamber.

DETAILED DESCRIPTION OF THE PREFERRED EMBODIMENT

Figure 1:
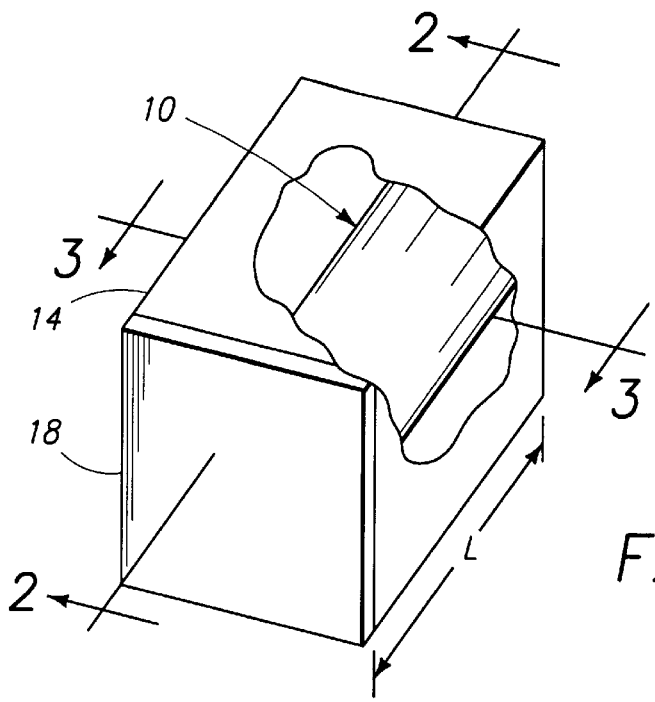
FIG. 1 is an isometric view of an oven according to the present invention.

FIG. 1 illustrates an oven 10 positioned in a cabinet 14. A door 18 seals one end of the oven 10. The door 18 opens and closes so as to provides access to the inside of the oven 10 and allows items to be inserted or removed from the oven 10. The cabinet 14 surrounds the oven 10 so that the oven 10 is enclosed within the cabinet 14. However, this is mainly for cosmetic purposes, so the cabinet 14 is not an essential part of the oven 10. In the preferred embodiment, the cabinet 14 is comprised of painted mild steel. However, the cabinet 14 could be comprised of many other materials. The cabinet 14 has a length "L". In the preferred embodiment, L equals approximately twenty inches.

Figure 2:
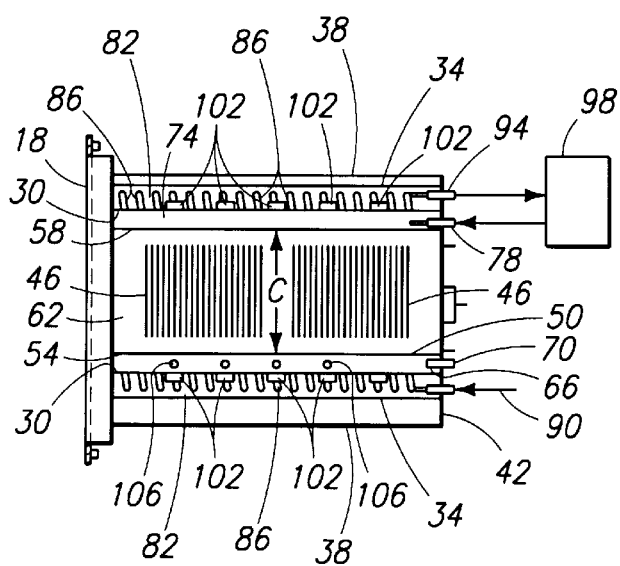
FIG. 2 is a cross-sectional view taken along the line 2—2 shown in FIG. 1.

FIG. 2 illustrates that the oven 10 is comprised of a first canister 30, a second canister 34 and a third canister 38. The first canister 30 is a hollow cylinder that extends from the door 18 to a rear wall 42. A plurality of items 46 are placed inside the first canister 30 for heating. The items 46 rest on a shelf 50. A first porous stainless steel layer 54 is positioned underneath the shelf 50. A second porous stainless steel layer 58 is positioned a distance "c" above the shelf 50, so that a chamber 62 is formed between the shelf 50 and the layer 58.

A chamber 66 is formed between the stainless steel layer 54 and the underlying wall of the first canister 30. A valve 70 extends through the rear wall 42 and into the chamber 66. The valve 70 is an on/off valve adapted for attachment to a vacuum pump. The valve 70 allows the chamber 66 to be evacuated by the vacuum pump attached to the valve 70 so that a vacuum in the range of approximately 0.01 millimeters of mercury ($10^{-2}$ torr) to one torr is established inside of the first canister 30. In other applications, pressures as low as $10^{-7}$ torr are utilized.

A chamber 74 is formed between the stainless steel layer 58 and the overlying wall of the first canister 30. A valve 78 extends through the rear wall 42 and into the chamber 74. The valve 78 is an on/off valve adapted for attachment to a source of inert gas, such as nitrogen. The valve 78 allows the chamber 74 to be filled with the inert gas, which also fills the rest of the inside of the first canister 30.

The second canister 34 is a hollow cylinder that extends from the door 18 to the rear wall 42. The first canister 30 is completely surrounded by the second canister 34. A cavity 82 (also called space 82) is defined by the space that exists between outside surface of the first canister 30 and the inside surface of the second canister 34. A continuous hollow tube 86 is coiled around the first canister 30 from the end of the first canister 30 adjacent to the wall 42 to the end of the first canister 30 adjacent to the door 18. An on/off valve 90 allows a gas, preferably an inert gas, to be introduced into the tube 86. An on/off valve 94 allows the gas to exit the tube 86. In the preferred embodiment, the gas is nitrogen gas and a heater 98 accepts the nitrogen gas after it exits the valve 94. The heater 98 heats the nitrogen gas and redirects it to the chamber 74 through the valve 78.

A plurality of heating elements 102 are positioned around the first canister 30. In the preferred embodiment, there are five of the heating elements 102, and each heating elements 102 comprises a circumferential band heater. Each band heater is connected to a controller which allows the temperature of the band heater to be controlled. Each of the heating elements 102 has a thermocouple 106 associated with it to monitor the temperature of the canister 30 in the region around the heating element. Each thermocouple is connected to one of the controllers to provide temperature information to the controller about the output from the band heater associated with the thermocouple.

Each band heater is a resistive heater that is capable of heating a region of the first canister 30 to a temperature of approximately 450° C. and is controllable to approximately ±1° C. The band heaters are powered by a 240 V alternating current source. The band heaters and thermocouples 106 are available from commercial sources such as Tempco Electric Heater Corporation of Wood Dale, Ill., USA.

Figure 3:
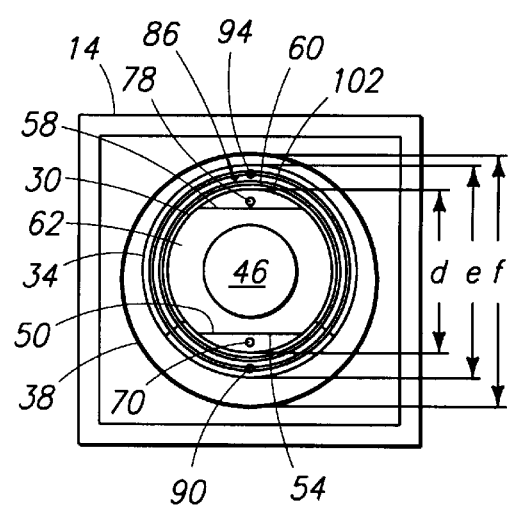
FIG. 3 is a cross-sectional view taken along the line 3—3 shown in FIG. 1.

The heating elements 102 are positioned in the cavity 82 in contact with the canister 30 and encircle the canister 30 (see FIG. 3). The hollow tubes 86 are positioned in the cavity 82 with a gap 60 existing between the heating elements 102 and the hollow tubes 86 (see FIG. 3).

The third canister 38 is a hollow cylinder that extends from the door 18 to the rear wall 42 and that completely encloses the first canister 30 and the second canister 34. In the preferred embodiment, the third canister 38 comprises a heavy stainless steel cylinder capable of holding a vacuum down to $10^{-7}$ torr.

FIG. 3 illustrates that in the preferred embodiment, the first canister 30 has a circular cross section with a diameter measurement "d" of approximately thirty centimeters (cm). The wall of the first canister 30 has a thickness of approximately 0.06 inches and is comprised of stainless steel. The stainless steel is a commercially available alloy designated as SS 316L. The first canister 30 can be removed from the oven 10 so that maintenance tasks such as cleaning the first canister 30 and servicing the heating element 102 can be completed. The ends of the first canister 30 are open and do not tightly abut the wall 42 and the door 18. This loose fit creates a passageway between the ends of the canister 30 and the wall 42 and the door 18 when the door 18 is closed. This allows the atmosphere inside of the canister 30 to equilibrate with the atmosphere within the rest of the oven 10 (i.e. if a vacuum is pulled inside the canister 30, the entire volume of the oven 10 is evacuated).

The second canister 34 has a circular cross section with a diameter measurement "e" of approximately 40 cm. The wall of the second canister 34 has a thickness of approximately 0.06 inches and is comprised of stainless steel. The stainless steel is a commercially available alloy designated as SS 316L. As with the first canister 30, the ends of the second canister 34 are open and do not tightly abut the wall 42 and the door 18.

The third canister 38 has a circular cross section with a diameter measurement "f" of approximately 50 cm. The wall of the third canister 38 has a thickness of approximately 0.25 inches and is comprised of stainless steel. The stainless steel is a commercially available alloy designated as SS 316L.

Examination of FIG. 3 illustrates that the third canister 38 completely surrounds the second canister 34 in the circumferential direction and that the second canister 34 completely surrounds the first canister 30 in the circumferential direction. The heating elements 102 encircle the first canister 30 as do the hollow tubes 86. A gap 60 exists between the heating elements 102 and the hollow tubes 86. A chamber 62 is defined by the space between the stainless steel layer 58 and the shelf 50, and the item 46 is positioned in the chamber 62. The ends of the third canister 38 tightly abut the wall 42 and the door 18 so that a gas tight seal is formed when the door 18 is closed. This seal enables a vacuum of at least approximately $10^{-2}$ torr to be maintained within the canister 38, and preferably approximately $10^{-7}$ torr.

The stainless steel layers 54 and 58 are comprised of a stainless steel material referred to as "Mott porous metal media" (also called Mott plate). The Mott plate is a rectangular slab of the porous stainless steel having a pore size in the range of 0.5 to 100 micrometers ($\mu$m). Preferably, the pore size is in the range of 40 to 100 $\mu$m. The pores in the Mott plate allow gas to pass through the stainless steel so that the nitrogen gas entering the chamber 74 can pass through the stainless steel layer 58 into the chamber 62. Similarly, the nitrogen gas in the chamber 74 can pass through the stainless steel layer 54 and be evacuated by the vacuum in the chamber 70. The stainless steel layers 54 and 58 thus form a plenum that allows nitrogen to be evenly distributed within the chamber 62. The Mott plate is commercially available from Mott Industrial (a division of Mott Company) of Farmington, Conn., USA. Mott porous metal media is frequently used in nitrogen filters to screen out particulate matter.

Figure 4:
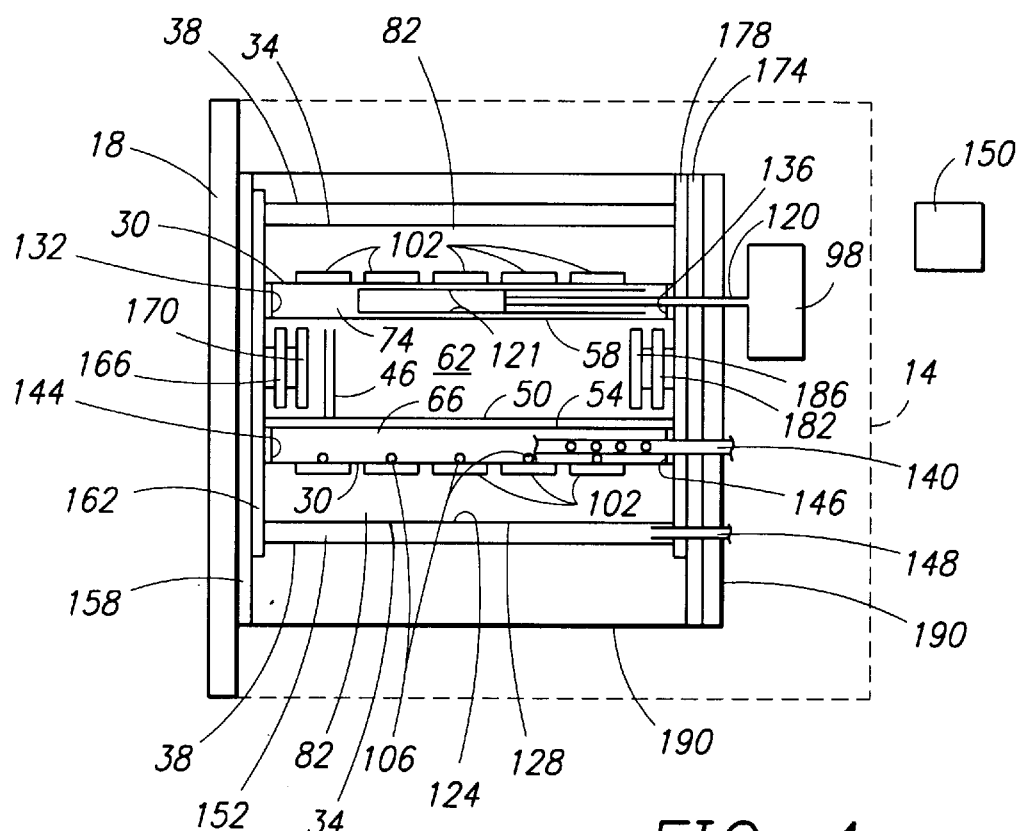
FIG. 4 is a cross-sectional view of another embodiment taken along the line 2—2 shown in FIG. 1.

FIG. 4 illustrates another embodiment of the oven 10. FIG. 4 is analogous to FIG. 2 and the components in FIG. 4 that are identical to components shown in FIG. 2 are identified with the same numerals. In FIG. 4, the tube 86 (shown in FIG. 2) has been removed. Instead, the inert gas (which is preferably nitrogen) is introduced into the chamber 74 (also called plenum 74) through a gas tube 120 that is connected to the heater 98. Inside of the chamber 74, the tube 120 branches into an H-shaped tube 121 perforated with holes, so that the gas is evenly distributed within the chamber 74. The chamber 74 has an approximately 0.10 inch thick layer 58 of Mott plate extending along its length as was described previously with respect to FIG. 1. Similarly, the chamber 66 has an approximately 0.10 inch thick layer 54 of Mott plate extending along its length as was described previously with respect to FIG. 1.

The second canister 34 has an inner surface 124 that faces the heating elements 102, and an outer surface 128 that faces the third canister 38. The canister 34 is comprised of stainless steel and the inner surface 124 has a number eight (No. 8) mirror finish. The mirror finish on the inner surface 124 causes the canister 34 to reflect heat back toward the first canister 30.

Inert gas (preferably nitrogen) is introduced into the chamber 74 through the gas tube 120. The gas is heated by the heater 98 before it is introduced into the chamber 74. The ends of the chamber 74 are sealed by a front wall 132 and a back wall 136 so that the gas cannot escape through the ends of the chamber. A vacuum is pulled on the chamber 66 through a vacuum tube 140. In the preferred embodiment, the vacuum tube 140 is a hollow elongated stainless steel rod which is connected to a vacuum pump. The rod has holes in it along the portion of the rod that is inside the chamber 66 so that the effect of vacuum is distributed uniformly along the length of the chamber 66. The ends of the chamber 66 are sealed by a front wall 144 and a back wall 146. A lower vacuum tube 148 is positioned in a chamber 152 so that a vacuum can be pulled on the chamber 152 formed between the second canister 34 and the third canister 38.

Each heating element 102 has an individual thermocouple 106 associated with it to control the temperature of the particular heating element 102. The thermocouples 106 are in turn connected to a controller 150 that controls the thermocouples and keeps them within ±1° C. of the target temperature. A suitable controller 150 is commercially available from Oakleaf Engineering, Inc., of Redwood City, Calif., under the trademark BeyondPID™ controller. The controller 150 is positioned outside of the cabinet 14 to allow the user to select specific temperatures, lengths of heating time and other parameters for the heating elements 102. The power for the heating elements 102 is preferably 208 volt three phase power controlled by solid state relays.

The ends of the oven 10 are sealed in a symmetrical fashion so that the heating along the entire length of the of the first canister 30 is as uniform as possible. Specifically, at the end adjacent to the door 18, a stainless steel plate 158 is attached to the door 18. A stainless steel plate 162 is attached to the plate 158. Preferably, the plate 162 is separated from the plate 158 by a two inch space. A first baffle 166 is attached to the plate 162 separated by a one inch space, and a second baffle 170 is attached to the first baffle 166 separated by a one inch space. The baffles 166 and 170 are both comprised of stainless steel and extend inside the chamber 62 to reflect heat back into the chamber 62. In the preferred embodiment, these components have the following approximate thicknesses: plate 158—0.75 inches; plate 162—0.187 inches; baffles 166 and 170–0.030 inches.

A gasket is positioned in the plate 162 so that an airtight seal with the third canister 38 is formed. The canisters 30 and 34 abut the plate 162, but do not form an airtight seal with it. This allows the inert gas from the chamber 74 to fill the chambers 82 and 152, and allows the vacuum from the chamber 66 to reach the chambers 82 and 152. The door 18 is mounted on hinges so that it can be opened and closed as desired.

Similarly, to maintain the thermal symmetry of the system, the end of the oven 10 away from the door 18 is sealed by a plate 174 (analogous to plate 158), a plate 178 (analogous to plate 162), and baffles 182 and 186 (analogous to baffles 166 and 170 respectively). A gasket is positioned in the plate 178 so that an airtight seal with the third canister 38 is formed. The canisters 30 and 34 abut the plate 178, but do not form an airtight seal with it.

In the preferred embodiment, an aluminum housing 190 is positioned around the oven 10, inside of the housing 14, so that air can be pumped around the oven 10 to assist in cooling down the oven 10.

In the embodiment of the oven 10 illustrated in FIG. 4, the length "L" (shown in FIG. 1) is approximately forty-one inches. The length of the canister 30 is approximately twenty-four inches. The diameters "d", "e" and "f" (shown in FIG. 3) are approximately 15.0 inches, 21.25 inches and 22.75 inches, respectively.

Figure 5:
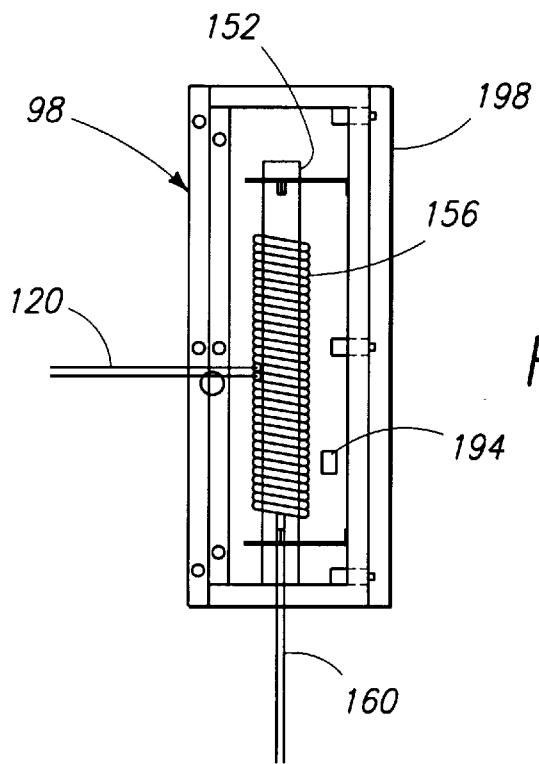
FIG. 5 is a schematic diagram of a gas pre-heater.

FIG. 5 illustrates that the heater 98 is comprised of a cartridge heater 152 and a hollow stainless steel tube 156. A segment 160 of the tube 156 extends outside of the heater 98 and is connected to a gas source (preferably nitrogen). The tube 156 coils around part of the cartridge heater 152 so that gas flowing inside the tube 156 is heated. The gas tube 120 is a segment of the tube 156 that directs heated gas into the chamber 74. A thermocouple 194 controls the temperature of the cartridge heater 152. The thermocouple is in turn controlled by the controller 150. Preferably, the controller 150 will hold the cartridge heater 152 at the same temperature as the heaters 102, so that the inert gas is heated to the same temperature as the inside of the chamber 62. A housing 198 surrounds the cartridge heater 152.

The oven 10 illustrated in FIG. 4 functions as follows: In the preferred embodiment, the items 46 are a plurality of semiconductor wafers (e.g. silicon wafers) on which a uniform layer of polyimide has been coated to act as a dielectric layer. The oven 10 is used to bake the wafers so that the polyimide (or other dielectric layer) will degas and solidify.

The heating elements 102 are used to heat the oven 10 to approximately 150° C. The door 18 is then opened, the items 46 are positioned in the chamber 62 and the door 18 is closed. The canisters 30, 34 and 38 are evacuated to about 10 torr using the vacuum pump attached to the vacuum tubes 140 and 148. The tubes 140 and 148 are then closed and the chamber 62 is filled with gas using the gas tube 120 to fill the chamber 62 with gaseous nitrogen (preheated to approximately 150° C.). The nitrogen gas enters the chamber 74 and moves through the porous stainless steel layer 58 to fill the chamber 62. The gas flow is then stopped and the canister 30 is evacuated again to about 10 torr, and then refilled with nitrogen. This cycle is repeated several times (preferably a total of at least three vacuum/gas fill cycles) until there is essentially no oxygen in the chamber 62.

A steady stream of hot nitrogen gas is then allowed to flow through the chamber 62 with the gas flow and vacuum tube 140 adjusted to maintain a reduced pressure of about 200 torr in the chamber 62. The vacuum tube 148 remains closed during this steady state process. This creates a vertical laminar flow of nitrogen across the vertical axis of the items 46 placed in the chamber 62. The heating elements 102 continue to heat the first canister 30 up to a temperature of approximately 450° C. The heater 98 heats the nitrogen gas up to approximately 450° C. at the same rate because the thermocouple 194 is synchronized with the thermocouples 106 by the controller 150.

With the present invention, this heating occurs at a rate in the range of 10 to 30° C./min. This rapid rate of heating is achievable because of the minimal thickness of the first canister 30. However, because of the minimal thickness of the first canister 30, heat tends to radiate out from the canister 30. To minimize this problem the inside surface 124 of the second canister 34 is finished with a number eight (No. 8) mirror finish to reflect the radiated heat back toward the canister 30. The baffles 166, 170, 182 and 186 also radiate heat back into the canister 30, but they are not finished with a No. 8 mirror finish.

For polyimide baking, once the temperature reaches 450° C., it is held at that level for approximately sixty minutes. After sixty minutes, the heating elements are turned off and the first canister 30 is allowed to cool to about 150° C. The cooling occurs at a rate of about 10 to 30° C./min. The cooling process is assisted by pumping air through the housing 190 around the outside of the canister38. By keeping the third canister from heating all the way up to 450° C., the cool down cycle occurs more quickly than in ovens of the prior art.

It should be noted that some or all of the parameters given above for processing polyimide wafers can be changed to fit the requirements of a particular process. For example, in some cases it may be desirable to place the wafers in the oven 10 when the oven is at room temperature, and then begin the heating. The controller 150 for the heating elements 102 provides the flexibility to change the temperature of the heating elements 102 to any value that is desired. Additionally, the time that the heating elements 102 remain at a temperature can also be set by the controller 150.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A rapid heating and cooling oven comprising:

a first canister adapted for holding one or more items to be heated to a temperature of approximately 450° C., the first canister having a first inner surface and a first outer surface;

a first chamber formed in the first canister for allowing an inert gas to be introduced uniformly into the first canister;

a second chamber formed in the first canister through which the inert gas is removed from the first canister;

a second canister that encircles the first canister, the second canister having a second inner surface and a second outer surface with a first cavity being formed between the first outer surface and the second inner surface;

at least one heating element for heating the first canister to a temperature of approximately 450° C., the heating element being positioned in the first cavity in thermal contact with the first outer surface;

a third canister that encircles the second canister, the third canister being adapted to hold a vacuum of at least approximately one torr;

inert gas supply means for introducing an inert gas into the first chamber; and vacuum supply means for allowing a vacuum to be drawn through the second chamber.

2. The rapid heating and cooling oven of claim 1 wherein the first canister is comprised of stainless steel having a thickness of approximately 0.06 inches.

3. The rapid heating and cooling oven of claim 1 wherein the first canister is cylindrical in shape and has a diameter of approximately fifteen inches.

4. The rapid heating and cooling oven of claim 1 wherein the first chamber has a layer of porous stainless steel positioned along one side.

5. The rapid heating and cooling oven of claim 1 wherein the second chamber has a layer of porous stainless steel positioned along one side.

6. The rapid heating and cooling oven of claim 1 wherein the heating element comprises a band heater.

7. The rapid heating and cooling oven of claim 1 further comprising:

heating means for heating the inert gas before the inert gas enters the first chamber.

8. The rapid heating and cooling oven of claim 1 wherein the second inner surface comprises stainless steel having a finish that reflects heat back toward the first outer surface.

9. The rapid heating and cooling oven of claim 4 wherein the finish is a number eight mirror finish.

10. A rapid heating and cooling oven comprising:

a first canister adapted for holding one or more items to be heated to a temperature of approximately 450° C., the first canister having a first inner surface and a first outer surface;

a first chamber formed in the first canister for allowing an inert gas to be introduced uniformly into the first canister, the first chamber having a floor comprised of a porous stainless steel layer having a pore size in the approximate range of 40 to 100 micrometers;

a second chamber formed in the first canister through which the inert gas is removed from the first canister by a vacuum, the second chamber having a ceiling comprised of a porous stainless steel layer having a pore size in the approximate range of 40 to 100 micrometers;

a second canister that encircles the first canister, the second canister having a second inner surface and a second outer surface with a first cavity being formed between the first outer surface and the second inner surface, the second inner surface having a thermally reflective mirror finish on it;

a plurality of band heaters for heating the first canister to a temperature of approximately 450° C., the plurality of band heaters being positioned in the first cavity in thermal contact with the first outer surface;

a third canister that encircles the second canister, the third canister being adapted to hold a vacuum of at least approximately one torr;

inert gas supply means for introducing an inert gas into the first chamber; and vacuum supply means for allowing a vacuum to be drawn through the second chamber.

11. The rapid heating and cooling oven of claim 10 wherein the inert gas supply means comprises a porous hollow tube extending along most of the length of the first chamber.

12. The rapid heating and cooling oven of claim 10 wherein the vacuum supply means comprises a porous hollow tube extending along most of the length of the second chamber, the porous hollow tube being connected to a vacuum pump capable of pulling a vacuum of at least one torr.

* * * * *